(12) United States Patent
Hwang et al.

(10) Patent No.: US 8,008,684 B2
(45) Date of Patent: Aug. 30, 2011

(54) LIGHT EMITTING DEVICE AND METHOD FOR MANUFACTURING THE SAME

(75) Inventors: Sung Min Hwang, Anyang-si (KR); Hyun Kyong Cho, Seoul (KR); Gyeong Geun Park, Gwacheon-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/500,988

(22) Filed: Jul. 10, 2009

(65) Prior Publication Data

US 2010/0096641 A1     Apr. 22, 2010

(30) Foreign Application Priority Data

Oct. 20, 2008  (KR) .................. 10-2008-0102799

(51) Int. Cl.
*H01L 33/00* (2010.01)
(52) U.S. Cl. .................. 257/99; 257/E33.005
(58) Field of Classification Search .......... 257/99, 257/E33.005, E33.051, E33.065
See application file for complete search history.

(56) References Cited

U.S. PATENT DOCUMENTS

| | | | |
|---|---|---|---|
| 5,491,350 A * | 2/1996 | Unno et al. | 257/99 |
| 7,015,513 B2 * | 3/2006 | Hsieh | 257/99 |
| 2006/0261323 A1 | 11/2006 | Suh et al. | |
| 2007/0145391 A1 * | 6/2007 | Baik et al. | 257/94 |
| 2007/0145392 A1 * | 6/2007 | Haberern et al. | 257/97 |
| 2007/0194324 A1 | 8/2007 | Kim et al. | |
| 2008/0217638 A1 | 9/2008 | Choi | |
| 2009/0283783 A1 | 11/2009 | Streubel | |

FOREIGN PATENT DOCUMENTS

| | | |
|---|---|---|
| KR | 10-2005-0029167 A | 3/2005 |
| KR | 10-2005-0060740 A | 6/2005 |
| KR | 10-0638819 B1 | 10/2006 |
| KR | 10-0723150 B1 | 5/2007 |
| KR | 10-0730755 B1 | 6/2007 |
| KR | 10-2008-0068243 | 7/2008 |
| KR | 10-2010-0003469 | 1/2010 |

* cited by examiner

*Primary Examiner* — Mark Prenty
(74) *Attorney, Agent, or Firm* — Birch, Stewart, Kolasch & Birch, LLP

(57) ABSTRACT

A light emitting device according to an embodiment is provided. The light emitting device comprises a second electrode layer, a third conductive semiconductor layer comprising a schottky contact region and an ohmic contact region on the second electrode layer, a second conductive semiconductor layer on the third conductive semiconductor layer, an active layer on the second conductive semiconductor layer, a first conductive semiconductor layer on the active layer, and a first electrode layer on the first conductive semiconductor layer.

19 Claims, 6 Drawing Sheets

LIGHT EMITTING DEVICE AND METHOD FOR MANUFACTURING THE SAME

The present application claims priority under 35 U.S.C. 119 and 35 U.S.C. 365 to Korean Patent Application No. 10-2008-0102799 (filed on Oct. 20, 2008), which is hereby incorporated by reference in its entirety.

BACKGROUND

The present disclosure relates to a light emitting device and method for manufacturing the same.

Recently, devices using light emitting diodes (LED) have been widely used as light emitting devices.

An LED converts an electrical signal into light by using characteristics of compound semiconductors. An LED includes a first conductive semiconductor layer, an active layer and a second conductive semiconductor layer which are stacked, and radiates light through the active layer according to the application of a power supply source. The first conductive semiconductor layer may be an n-type semiconductor layer, and the second conductive semiconductor layer may be a p-type semiconductor layer. Alternatively, the first conductive semiconductor layer may be the p-type semiconductor layer, and the second conductive semiconductor layer may be the n-type semiconductor layer.

In a vertical LED structure where a first electrode layer that applies the power supply source to the first conductive semiconductor layer and a second electrode layer that applies the power supply source to the second conductive semiconductor layer are disposed in a vertical direction, current channeling can occur at the lower side of the first electrode layer.

When current channeling occurs at the lower side of the first electrode layer, an operation voltage increases, the life of the light emitting device shortens and reliability of the light emitting device decreases.

Moreover, because light is mainly produced from the active layer at the lower side of the first electrode layer, it is not extracted to the outside of the light emitting device and is reflected by the first electrode layer and absorbed in the light emitting device. Accordingly, the light efficiency of the light emitting device decreases.

SUMMARY

Embodiments provide a light emitting device having a new structure and a method for manufacturing the same.

Embodiments provide a light emitting device and method for manufacturing the same, which can remove current channeling.

Embodiments provide a light emitting device and method for manufacturing the same, which can be driven at a stable operation voltage and improve light extraction efficiency.

Embodiments provide a light emitting device and method for manufacturing the same, which can decrease a leakage current or an electrical short.

In an embodiment, a light emitting device comprises: a second electrode layer; a third conductive semiconductor layer comprising a schottky contact region and an ohmic contact region on the second electrode layer; a second conductive semiconductor layer on the third conductive semiconductor layer; an active layer on the second conductive semiconductor layer; a first conductive semiconductor layer on the active layer; and a first electrode layer on the first conductive semiconductor layer.

In an embodiment, a light emitting device comprises: a second electrode layer; a third conductive semiconductor layer comprising a third region having a third thickness and a fourth region having a fourth thickness thinner than the third thickness, on the second electrode layer; a second conductive semiconductor layer on the third conductive semiconductor layer; an active layer on the second conductive semiconductor layer; a first conductive semiconductor layer on the active layer; and a first electrode layer on the first conductive semiconductor layer, wherein at least one portion of the first electrode layer overlaps with the third region in a vertical direction.

In an embodiment, a light emitting device comprises: a second electrode layer; a third conductive semiconductor layer comprising a third region which has a third thickness and is disposed at a peripheral portion, and a fourth region having a fourth thickness thinner than the third thickness, on the second electrode layer; a second conductive semiconductor layer on the third conductive semiconductor layer; an active layer on the second conductive semiconductor layer; a first conductive semiconductor layer on the active layer; and a first electrode layer on the first conductive semiconductor layer.

The details of one or more embodiments are set forth in the accompanying drawings and the description below. Other features will be apparent from the description and drawings, and from the claims.

DETAILED DESCRIPTION OF THE PREFERRED EMBODIMENTS

Reference will now be made in detail to the embodiments of the present disclosure, examples of which are illustrated in the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'. Moreover, any reference of the 'on' or 'under' of each layer will be described with reference to the accompanying drawings.

In the figures, the dimensions of layers and regions are exaggerated or schematically illustrated for convenience and clarity of illustration. Also, the size of each element does not entirely reflect an actual size.

Hereinafter, a light emitting device and method for manufacturing the same according to embodiments will be described in detail with reference to the accompanying drawings.

FIGS. 1 to 5 are diagrams illustrating a light emitting device and method for manufacturing the same according to an embodiment.

Figure 5:
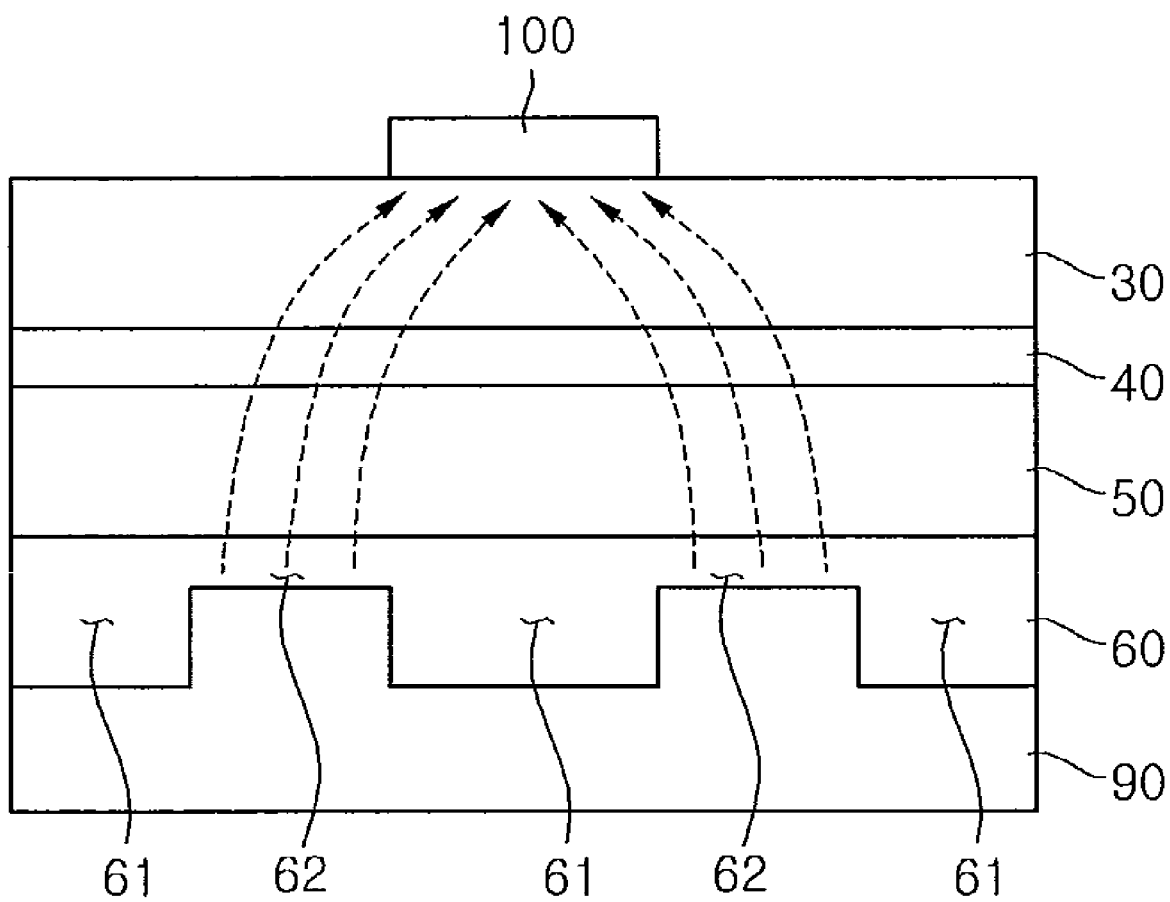

Referring to FIG. 5, a light emitting device according to an embodiment includes a second electrode layer 90, a third conductive semiconductor layer 60 formed on the second electrode layer 90, a second conductive semiconductor layer 50, an active layer 40 and a first conductive semiconductor layer 30 formed on the third conductive semiconductor layer 60, a first electrode layer 100 formed on the first conductive semiconductor layer 30.

The second electrode layer 90 may include a region having a first thickness and a second thickness thinner than the first thickness. The third conductive semiconductor layer 60 formed on the second electrode layer 90 may include a third thickness and a fourth thickness thinner than the third thickness. Herein, the third thickness may be formed to about 100 to about 1,000 Å, and the fourth thickness may be formed to about 10 to about 90 Å.

For example, the first conductive semiconductor layer 30 may be formed as an n-type semiconductor layer, the second conductive semiconductor layer 50 may be formed as a p-type semiconductor layer, and the third conductive semiconductor layer 60 may be formed as an n-type semiconductor layer or an undoped nitride semiconductor layer.

The region having the fourth thickness of the third conductive semiconductor layer 60 which is formed on the region having the first thickness of the second electrode layer 90 is formed as an ohmic contact region 62. The region having the third thickness of the third conductive semiconductor layer 60 which is formed on the region having the second thickness of the second electrode layer 90 is formed as a schottky contact region 61.

The schottky contact region 61 and the ohmic contact region 62 are formed based on the thickness of the third conductive semiconductor layer 60.

Figure 7:
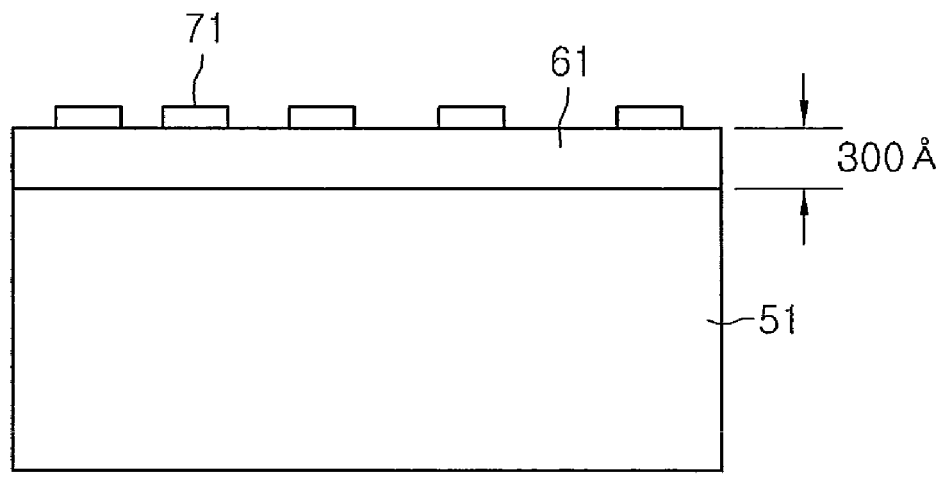
FIGS. 7 and 8 are diagrams for describing a schottky contact region and an ohmic contact region in the light emitting device according to an embodiment.
Figure 7:
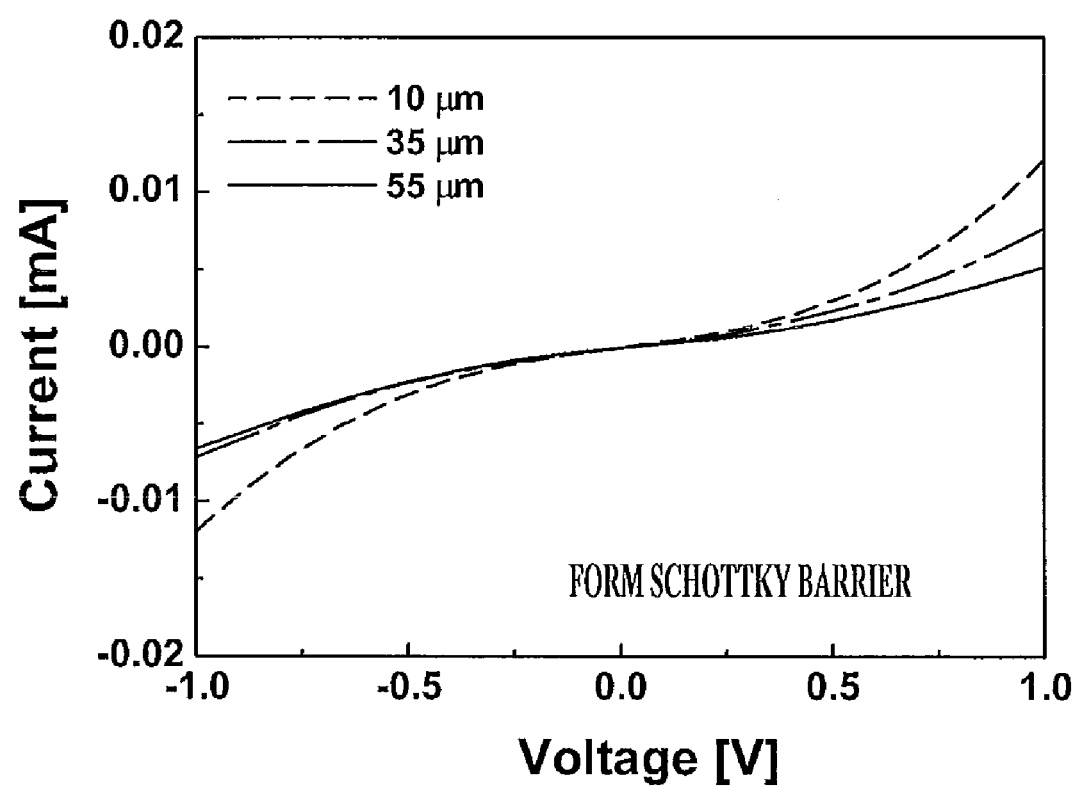
Figure 8:
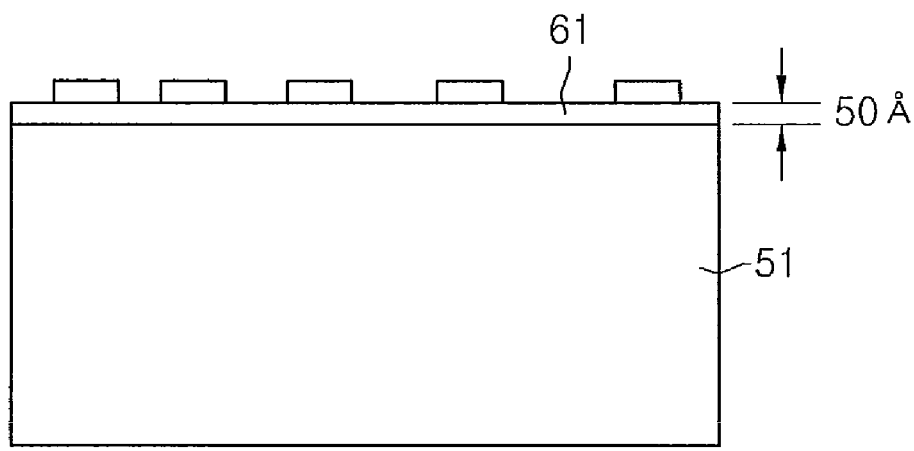
Figure 8:
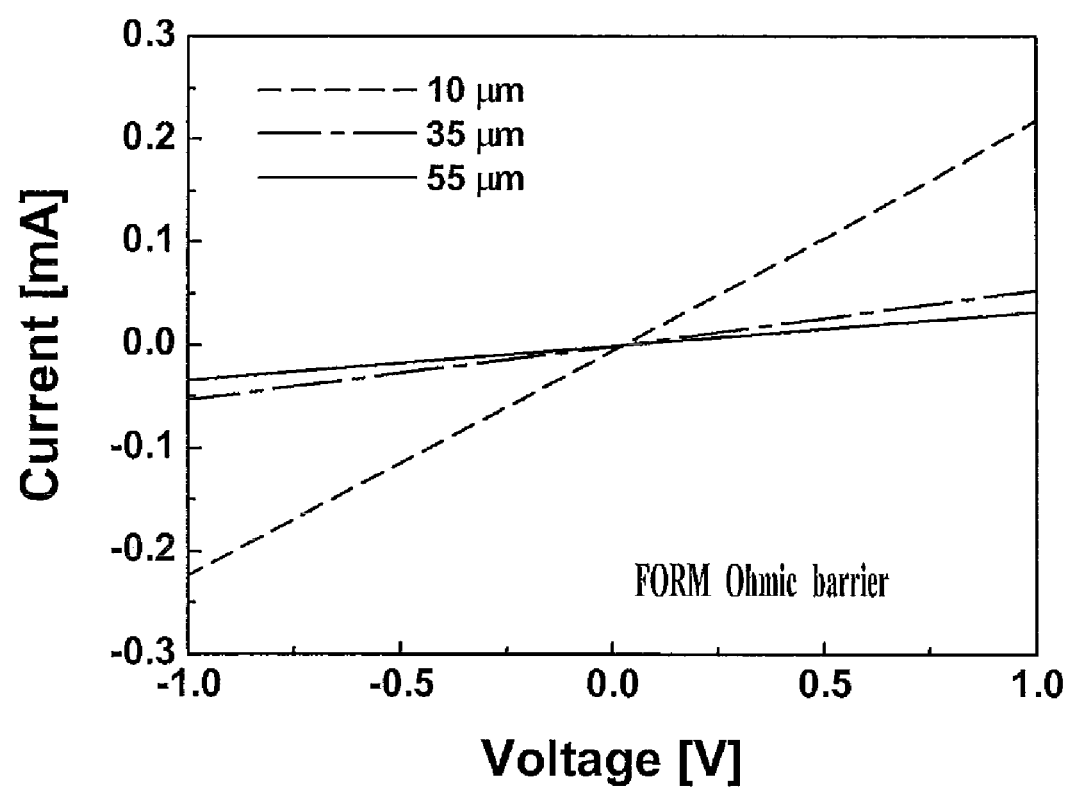

FIGS. 7 and 8 are diagrams illustrating an experiment structure and an experiment result for describing that in which the schottky contact region and the ohmic contact region are formed based on the thickness of the third conductive semiconductor layer, in the light emitting device according to an embodiment.

Referring to FIGS. 7 and 8, an n-type GaN layer 61 having a thickness of about 50 and about 300 Å?is formed on a P-type GaN layer 51, and a plurality of electrodes 71 are formed spaced apart on the n-type GaN layer 61. At this point, the n-type GaN layer 61 may be formed as an undoped layer GaN layer.

When a positive voltage and a negative voltage are applied to two of the electrode layers 71 respectively, a current passes through the n-type GaN layer 61 in a vertical direction from any one of the electrode layers 71 and then flows in a horizontal direction in the p-type GaN layer 51. Subsequently, the current passes through the n-type GaN layer 61 in a vertical direction and then flows into another one of the electrode layers 71.

The present experiment has been performed while adjusting the interval between the adjacent two electrode layers 71 to about 10 µm, 35 µm and 55 µm.

The experiment result shows schottky barrier characteristic when the thickness of the n-type GaN layer 61 is about 300 Å, and shows ohmic barrier characteristic when the thickness of the n-type GaN layer 61 is about 50 Å.

As shown through the experiment, it can be seen that the ohmic contact region 62 and the schottky contact region 61 are formed based on the thickness of the third conductive semiconductor layer 60 in the light emitting device according to an embodiment.

The ohmic contact region 62 and the schottky contact region 61 change the path of a current flowing in the light emitting device.

For example, at least one portion of the schottky contact region 61 may be formed at a position where it overlaps with the first electrode layer 100 in a vertical direction. That is, the first electrode layer 100 may be formed at the center portion of the top of the first conductive semiconductor layer 30, and the schottky contact region 61 may be formed at the center portion of the third conductive semiconductor layer 60.

Moreover, the schottky contact region 61 may be formed at the peripheral portion of the third conductive semiconductor layer 60, and may be disposed at a plurality of regions in the third conductive semiconductor layer 60. Likewise, the ohmic contact region 62 may be disposed at the plurality of regions in the third conductive semiconductor layer 60.

A current does not almost flow in the schottky contact region 61 because of a high resistance, and it can easily flow in the ohmic contact region 62 because of a low resistance.

In the light emitting device according to an embodiment, when the schottky contact region 61 is formed at the peripheral portion of the third conductive semiconductor layer 60, it decreases a current flowing in the peripheral portion or side surface of the light emitting device and thus can reduce current leakage. Moreover, because the schottky contact region 61 is formed to be thicker than the ohmic contact region 62, it increases distance between the second electrode layer 90 and the first electrode layer 100 or the first conductive semiconductor layer 30. Accordingly, the schottky contact region 61 prevents an electrical short from occurring in the light emitting device, improving the electrical characteristic of the light emitting device.

As indicated by dotted lines in FIG. 5, therefore, a current which flows from the second electrode layer 90 into the first electrode layer 100 does not almost flow through the schottky contact region 61, and it flows into the first electrode layer 100 through the ohmic contact region 62.

The second electrode layer 90 may include a conductive substrate, and a reflection electrode layer formed on the conductive substrate.

For example, the conductive substrate may be formed of at least one of copper (Cu), titanium (Ti), chromium (Cr), nickel (Ni), aluminum (Al), platinum (Pt), aurum (Au) and a semiconductor substrate into which impurity is injected. The reflection electrode layer may be formed of aluminum (Al) or argentum (Ag).

In the light emitting device according to an embodiment, when the schottky contact region 61 is formed at a position where it overlaps with the first electrode layer 100 in a vertical direction, a current which flows from the second electrode layer 90 into the first electrode layer 100 does not intensively flow only in a vertical direction with respect to the first electrode layer 100, and is also distributed in a horizontal direction and thereby flows into the broad regions of the second conductive semiconductor layer 50, the active layer 40 and the first conductive semiconductor layer 30.

Accordingly, the light emitting device according to an embodiment can prevent current channeling in which a current intensively flows in a vertical direction with respect to the first electrode layer 100. As a result, the light emitting device can be driven at a stable operation voltage.

Moreover, when a current intensively flows in a vertical direction with respect to the first electrode layer 100, light is mainly produced from the region of the active layer 40 that is disposed under the first electrode layer 100. However, there is high possibility that the light (which is produced from the active layer 40 under the first electrode layer 100) is absorbed into the first electrode layer 100 and thereby causes the decrease of a light amount, or is reflected by the first electrode layer 100 and thereby vanishes in the light emitting device.

In the light emitting device according to an embodiment, however, the schottky contact region 61 and the ohmic contact region 62 are formed under the second conductive semiconductor layer 50, and thus a current which flows from the second electrode layer 90 into the first electrode layer 100 is widely distributed and flows in a horizontal direction. Because light is produced at the broad region of the active layer 40, therefore, there is low possibility that the light (which is produced from the region of the active layer 40) is absorbed into the first electrode layer 100 or is reflected by the first electrode layer 100 and thus vanishes in the light emitting device. Accordingly, the light emitting device according to an embodiment can increase light efficiency.

Hereinafter, a method for manufacturing the light emitting device according to an embodiment will be described in detail with reference to FIGS. 1 to 5.

FIGS. 1 to 5 are diagrams illustrating a method for manufacturing the light emitting device according to an embodiment.

Figure 1:
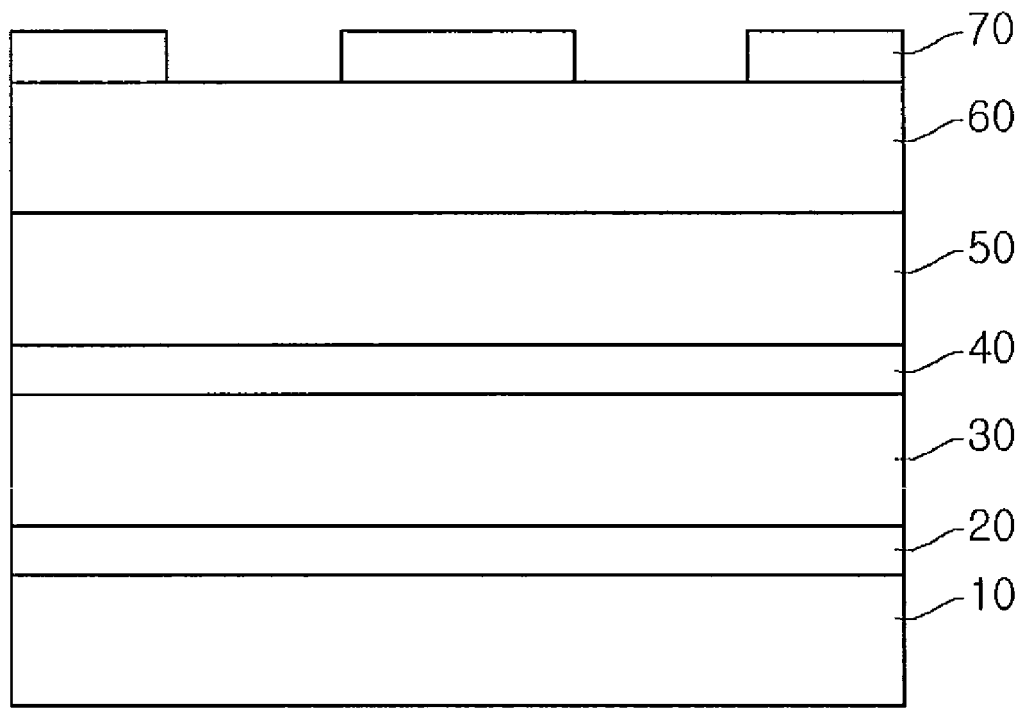
FIGS. 1 to 5 are diagrams illustrating a light emitting device and method for manufacturing the same according to an embodiment.

Referring to FIG. 1, an undoped GaN layer 20, the first conductive semiconductor layer 30, the active layer 40, the second conductive semiconductor layer 50 and the third conductive semiconductor layer 60 are formed on a substrate 10. Moreover, a buffer layer (not shown) may be further formed between the substrate 10 and the undoped GaN layer 20.

The substrate 10 may be formed of at least one of sapphire ($Al_2O_3$), Si, SiC, GaAs, ZnO and MgO.

The buffer layer (not shown) may be formed as a multilayer having a stack structure such as $Al_xIn_{1-x}N/GaN$, $In_xGa_{1-x}N/GaN$ and $Al_xIn_yGa_{1-x-y}N/In_xGa_{1-x}N/GaN$, or a layer comprising al least one of $Al_xIn_yGa_{1-x-y}N$, $Al_xGa_{1-x}N$, and $In_yGa_{1-y}N$ ($0 \leq x \leq 1$, $0 \leq y \leq 1$, $0 \leq x+y \leq 1$). For example, by injecting trimethyl gallium (TMGa), trimethyl indium (TMIn) and trimethyl aluminum (TMAl) together with hydrogen gas and ammonia gas into a chamber, the buffer layer may grow.

By injecting trimethyl gallium (TMGa) together with hydrogen gas and ammonia gas into the chamber, the undoped GaN layer 20 may grow.

The first conductive semiconductor layer 30 may be a nitride semiconductor layer into which a first conductive impurity ion is injected. For example, the first conductive semiconductor layer 30 may be a semiconductor layer into which an n-type impurity ion is injected. By injecting trimethyl gallium (TMGa) and a $SiN_4$ gas including an n-type impurity (for example, Si) together with hydrogen gas and ammonia gas into the chamber, the first conductive semiconductor layer 30 may grow.

The active layer 40 may be formed in a single quantum well structure or a multi-quantum well structure. For example, the active layer 40 may be formed in the stack structure of an InGaN well layer/GaN barrier layer or $Al_xIn_yGa_{1-x-y}N$ well layer/$Al_xIn_yGa_{1-x-y}N$ barrier layer ($0 \leq x \leq 1$, $0 \leq y \leq 1$, $0 \leq x+y \leq 1$). The second conductive semiconductor layer 50 may be a nitride semiconductor layer into which a second conductive impurity ion is injected. For example, the second conductive semiconductor layer 50 may be a semiconductor layer into which a p-type impurity ion is injected. By injecting trimethyl gallium (TMGa) and $(EtCp_2Mg)Mg(C_2H_5C_5H_4)_2$ including a p-type impurity (for example, Mg) together with hydrogen gas and ammonia gas into the chamber, the second conductive semiconductor layer 50 may grow.

The third conductive semiconductor layer 60 may be a nitride semiconductor layer into which a third conductive impurity ion is injected. For example, the third conductive semiconductor layer 60 may be a semiconductor layer into which an n-type impurity ion is injected. Like the first conductive semiconductor layer 30, by injecting trimethyl gallium (TMGa) and a $SiN_4$ gas including an n-type impurity (for example, Si) together with hydrogen gas and ammonia gas into the chamber, the third conductive semiconductor layer 60 may grow.

The mask layer 70 is formed on the third conductive semiconductor layer 60. The mask layer 70 is formed for selectively etching the third conductive semiconductor layer 60.

Figure 2:
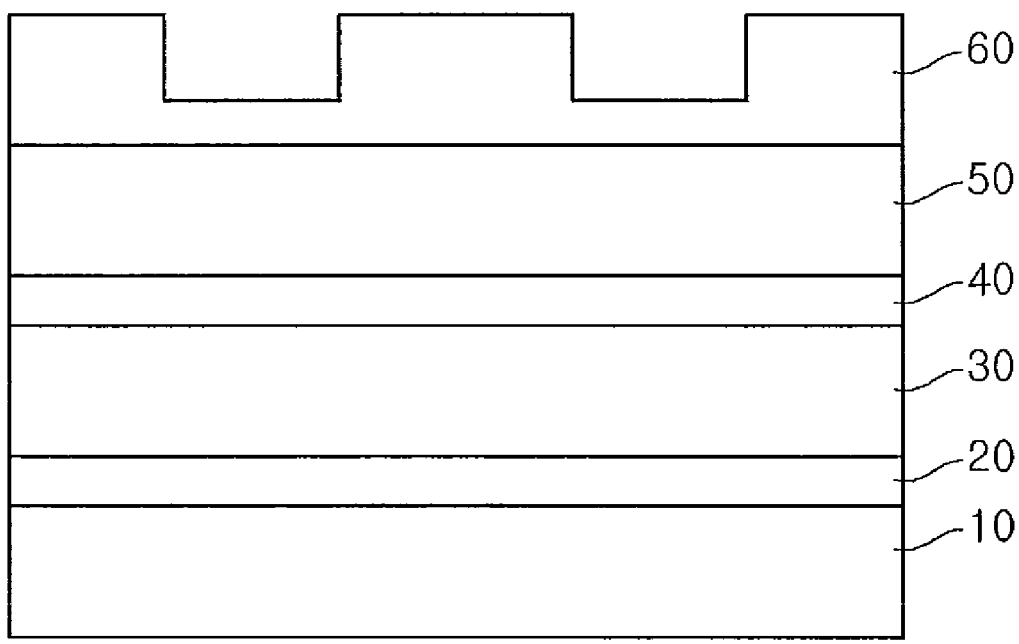

Referring to FIG. 2, the third conductive semiconductor layer 60 is selectively etched by using the mask layer 70 as a mask.

For example, the third conductive semiconductor layer 60 may be formed to a third thickness of about 100 to about 1,000 Å. The third conductive semiconductor layer 60 is selectively etched to have a fourth thickness of about 10 to about 90 Å by using the mask layer 70 as a mask.

Accordingly, the third conductive semiconductor layer 60 may be formed to the third thickness and the fourth thickness thinner than the third thickness.

Figure 3:
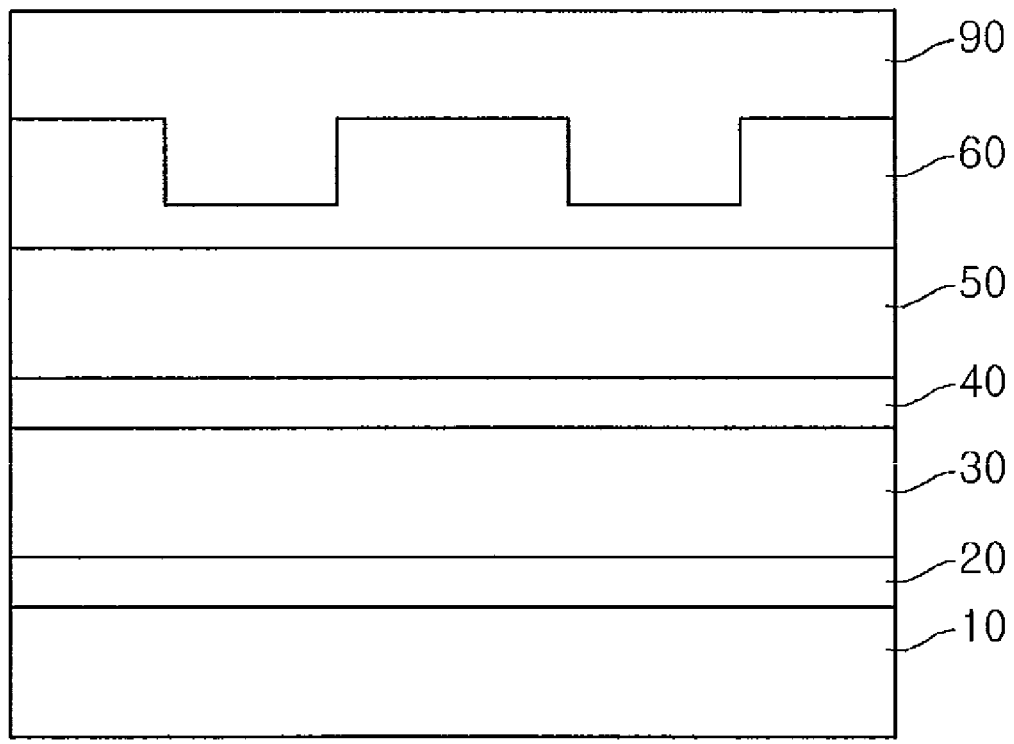

Referring to FIG. 3, the third conductive semiconductor layer 60 is selectively etched, and the second electrode layer 90 is formed on the third conductive semiconductor layer 60.

The second electrode layer 90 may be formed of a single layer or multilayer of a metal material such as Ni, Pd or Pt, metal alloy, or metal oxide. The metal oxide comprises at least one of ITO, IZO(In—ZnO), GZO(Ga—ZnO), AZO(Al—ZnO), AGZO(Al—Ga ZnO), IGZO(In—Ga ZnO), $IrO_x$, $RuO_x$, $RuO_x$/ITO, Ni/$IrO_x$/Au, Ni/$IrO_x$/Au/ITO. But, the material of the second electrode layer 90 is not limited to the disclosed materials.

The second electrode layer 90 may be formed as a reflection layer such as Ag, Al and APC, or may be formed as a conductive substrate. At this point, the reflection electrode layer is formed on the third conductive semiconductor layer 60, and the conductive substrate is formed on the reflection electrode layer.

Figure 4:
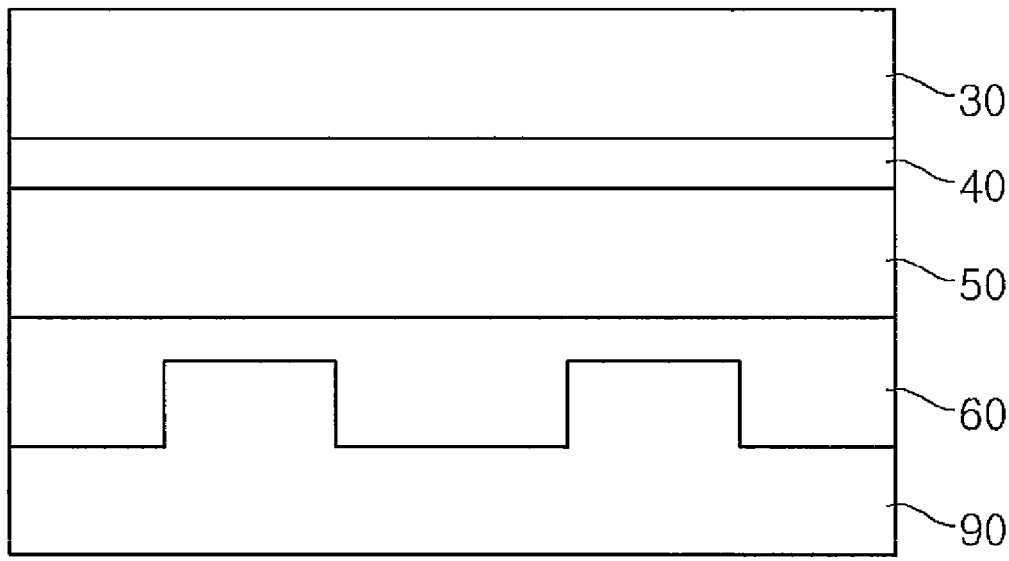

Referring to FIG. 4, the second electrode layer 90 is formed, and the substrate 10 and the undoped GaN layer 20 are removed. Herein, if a buffer layer has been formed, it would be also removed.

Referring to FIG. 5, the first electrode layer 100 is formed on the first conductive semiconductor layer 30.

The first electrode layer 100, for example, may be formed of at least one of Ti, Cr, Ni, Al, Pt, or Au.

The light emitting device according to an embodiment may be manufactured in the above-described method.

Figure 6:
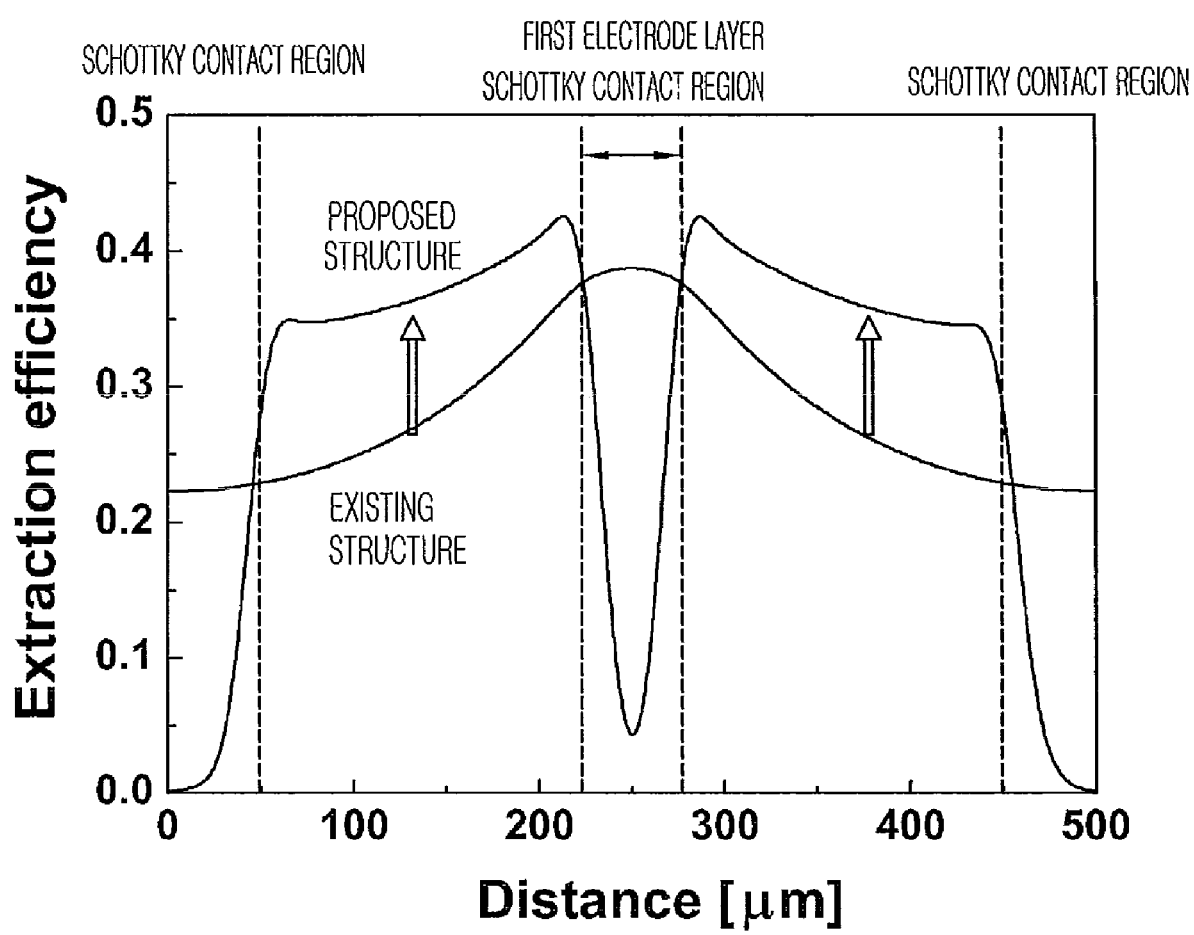
FIG. 6 is a diagram illustrating the light extraction characteristic of the light emitting device according to an embodiment.

FIG. 6 is a diagram illustrating the light extraction efficiency of the light emitting device according to an embodiment.

In FIG. 6, an X axis represents distance from the left end of the light emitting device to its right end in the cross-sectional surface of FIG. 5, and the schottky contact region 61 is disposed at portion corresponding to about 0 to about 50 μm, about 225 to about 275 μm and about 450 to about 500 μm. Assuming that the amount of light produced from the light emitting device is '1', a Y axis is a value that relatively represents the amount of light extracted from the light emitting device.

In FIG. 6, the existing structure of a light emitting device refers to a structure in which the third conductive semiconductor layer 60 is not formed between the second conductive semiconductor layer 50 and the second electrode layer 90. In the existing structure, as a current flows toward the center portion of the light emitting device, a high amount of current flows. Accordingly, the most amount of light is produced and extracted from the region of the active layer 40 that overlaps with the first electrode layer 100 in a vertical direction.

In a proposed structure according to an embodiment, because a current flows through the ohmic contact region 62 between the schottky contact regions 61, the most amount of light is produced and extracted from the active layer 40 which is in a position corresponding to a region in which ohmic contact region 62 is formed.

According to the existing structure, there is high possibility that the light (which is produced from the region of the active layer 40 that overlaps with the first electrode layer 100 in a vertical direction) is absorbed into the first electrode layer 100 and thereby causes the decrease of a light amount, or is reflected by the first electrode layer 100 and thereby vanishes in the light emitting device.

According to embodiments, on the other hand, as shown in FIG. 6, because a much amount of light is produced from the region of the active layer 40 that does not overlap with the first electrode layer 100 in a vertical direction, the amount of light (which is reflected by the first electrode layer 100 and thereby vanishes in the light emitting device) can decrease.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a second electrode layer;
a third conductive semiconductor layer comprising a schottky contact region and an ohmic contact region on the second electrode layer;
a second conductive semiconductor layer on the third conductive semiconductor layer;
an active layer on the second conductive semiconductor layer;
a first conductive semiconductor layer on the active layer; and
a first electrode layer on the first conductive semiconductor layer.

2. The light emitting device according to claim 1, wherein:
the first conductive semiconductor layer is an n-type semiconductor layer,
the second conductive semiconductor layer is a p-type semiconductor layer, and
the third conductive semiconductor layer is an n-type semiconductor layer or an undoped semiconductor layer.

3. The light emitting device according to claim 1, wherein:
the schottky contact region is formed at a center portion of the third conductive semiconductor layer, and
the ohmic contact region is formed at a periphery of the schottky contact region.

4. The light emitting device according to claim 3, wherein the schottky contact region is formed at a peripheral portion of the third conductive semiconductor layer.

5. The light emitting device according to claim 1, at least one portion of the first electrode layer overlaps with at least one of the schottky contact region in a vertical direction.

6. The light emitting device according to claim 1, wherein:
the schottky contact region has a thickness of about 100 to about 1,000 Å; and
the ohmic contact region has a thickness of about 10 to about 90 Å.

7. The light emitting device according to claim 1, wherein:
the second electrode layer under the ohmic contact region has a first thickness, and
the second electrode layer under the schottky contact region has a second thickness thinner than the first thickness.

8. A light emitting device, comprising:
a second electrode layer;
a third conductive semiconductor layer comprising a third region having a third thickness and a fourth region having a fourth thickness thinner than the third thickness, on the second electrode layer;
a second conductive semiconductor layer on the third conductive semiconductor layer;
an active layer on the second conductive semiconductor layer;
a first conductive semiconductor layer on the active layer; and
a first electrode layer on the first conductive semiconductor layer, wherein at least one portion of the first electrode layer overlaps with the third region in a vertical direction,
wherein the second electrode layer comprises:
a first region having a first thickness, disposed at a region where at least one portion of the first region overlaps with the fourth region in a vertical direction; and
a second region having a second thickness thinner than the first thickness, disposed at a region where at least one portion of the second region overlaps with the third region in a vertical direction.

9. The light emitting device according to claim 8, wherein:
the first conductive semiconductor layer is an n-type semiconductor layer,
the second conductive semiconductor layer is a p-type semiconductor layer, and
the third conductive semiconductor layer is an n-type semiconductor layer or an undoped semiconductor layer.

10. The light emitting device according to claim 8, wherein at least one portion of the third region is disposed at a center portion of the third conductive semiconductor layer.

11. The light emitting device according to claim 8, wherein:
the third region has a thickness of about 100 to about 1,000 Å; and
the fourth region has a thickness of about 10 to about 90 Å.

12. A light emitting device, comprising:
a second electrode layer;
a third conductive semiconductor layer comprising a third region which has a third thickness and is disposed at a peripheral portion, and a fourth region having a fourth thickness thinner than the third thickness, on the second electrode layer;
a second conductive semiconductor layer on the third conductive semiconductor layer;
an active layer on the second conductive semiconductor layer;

a first conductive semiconductor layer on the active layer; and a first electrode layer on the first conductive semiconductor layer, wherein a surface of the third conductive semiconductor layer contacting the second electrode layer has an uneven shape.

13. The light emitting device according to claim 12, wherein the third region comprises another third region disposed at a position which is separated from a peripheral portion of the third conductive semiconductor layer.

14. The light emitting device according to claim 12, wherein the third region comprises another third region disposed at a center portion of the third conductive semiconductor layer.

15. The light emitting device according to claim 14, wherein at least one portion of the first electrode layer overlaps with said another third region in a vertical direction.

16. The light emitting device according to claim 12, wherein the second electrode layer comprises:

a first region having a first thickness, disposed at a region where at least one portion of the first region overlaps with the fourth region in a vertical direction; and a second region having a second thickness thinner than the first thickness, disposed at a region where at least one portion of the second region overlaps with the third region in a vertical direction.

17. The light emitting device according to claim 12, wherein:

the first conductive semiconductor layer is an n-type semiconductor layer, the second conductive semiconductor layer is a p-type semiconductor layer, and the third conductive semiconductor layer is an n-type semiconductor layer or an undoped semiconductor layer.

18. The light emitting device according to claim 12, wherein:

the third region is formed to a thickness of about 100 to about 1,000 Å; and the fourth region is formed to a thickness of about 10 to about 90 Å.

19. The light emitting device according to claim 12, wherein:

the third region is formed at a plurality of regions, and the fourth region is formed at a plurality of regions.

* * * * *